United States Patent [19]

Shibata

[11] Patent Number: 4,528,744
[45] Date of Patent: Jul. 16, 1985

[54] METHOD OF MANUFACTURING A SEMICONDUCTOR DEVICE

[75] Inventor: Tadashi Shibata, Yokohama, Japan

[73] Assignee: Tokyo Shibaura Denki Kabushiki Kaisha, Kawasaki, Japan

[21] Appl. No.: 482,229

[22] Filed: Apr. 5, 1983

[30] Foreign Application Priority Data

Apr. 8, 1982 [JP] Japan .................. 57-57240

[51] Int. Cl.$^3$ ........................................... H01L 21/88
[52] U.S. Cl. .......................................... 29/571; 29/578; 29/577 C; 29/590; 148/1.5; 148/179
[58] Field of Search .................. 357/61 S, 65; 29/571, 29/576 W, 577 C, 578, 590; 148/179

[56] References Cited

U.S. PATENT DOCUMENTS

| | | | |
|---|---|---|---|
| 4,102,733 | 7/1978 | De La Moneda et al. | 156/653 |
| 4,141,022 | 2/1979 | Sigg et al. | 357/23 |
| 4,277,881 | 7/1981 | Godejaha, Jr. | 29/577 C |
| 4,305,200 | 12/1981 | Fu et al. | 29/571 |
| 4,356,622 | 11/1982 | Widmann | 29/571 |
| 4,419,809 | 12/1983 | Riseman et al. | 29/571 |

OTHER PUBLICATIONS

M. Morimoto et al; Japan J. Appl. Phys. vol. 20 Supp. 20-1, pp. 123-127, 1981.
T. Shibata et al.; iedm Technical Digest, pp. 647-650, 1981, (See Especially FIG. 5).
P. A. Gargini et al.; iedm Technical Digest, pp. 54-57, 1981.
Technical Disclosure Bulletin, IBM Fabricating a Gate Field–Effect Transistor, C. J. Kircher & H. N. Yu, vol. 13, No. 3, Aug. 1970.
IBM Technical Disclosure Bulletin, Interconnection Method for Integrated Circuits, C. J. Kircher & H. N. Yu, vol. 13, No. 2, Jul. 1970.

Primary Examiner—Brian E. Hearn
Assistant Examiner—Hunter L. Auyang
Attorney, Agent, or Firm—Oblon, Fisher, Spivak, McClelland & Maier

[57] ABSTRACT

A method of manufacturing a semiconductor device which comprises the steps of forming an interconnection layer through an insulating film on a semiconductor substrate, and connecting the diffusion interconnection region in the surface portion of said substrate to said interconnection layer by growing a metal or metal semiconductor compound on the surface of said substrate and the interconnection layer.

16 Claims, 19 Drawing Figures

METHOD OF MANUFACTURING A SEMICONDUCTOR DEVICE

BACKGROUND OF THE INVENTION

The present invention relates to a method of manufacturing a semiconductor device and, more particularly, to an improvement in a method for connecting a diffusion interconnection region to an interconnection layer in an MOS type device.

Heretofore, in an LSI (large-scale integrated circuit), an interconnection between elements has been carried out with a diffusion layer, a polysilicon layer and an aluminum layer. The connections between these interconnection layers, e.g., the connection between a diffusion layer and a polysilicon layer, has been performed by a so-called direct contact method which is also known as buried contact. However, the conventional connecting method employing the direct contact method has various problems. These will now be described with reference to the drawings.

FIG. 1A is a plan view showing part of an LSI having a direct contact portion. A gate electrode 101 and an interconnection layer 102, both of which are formed of poly-silicon, are disposed on a silicon substrate 100. Reference numerals 103 and 104 designate diffusion interconnection regions, which are, respectively, source and drain regions of an MOS transistor. A circuit equivalent to the device shown in FIG. 1A is indicated in FIG. 1B. The electrical connection between the layer 102 and the region 104 is performed in a direct contact portion 105 by a direct contact method.

FIGS. 2A to 2D are sectional views along A—A in FIG. 1A, showing schematic manufacturing steps of the device in FIG. 1A. For example, an oxide film 202 which becomes a gate oxide film is formed, for example, to a thickness of approx. 200 Å by thermal oxidation on a p-type silicon substrate 201. Subsequently, with a predetermined resist pattern (not shown) as a mask, a direct contact region 203 of the thermal oxide film 202 is selectively etched and removed, for example, with $NH_4F$, and the surface of the silicon substrate of the portion is exposed (FIG. 2A).

Then, a poly-silicon layer 204 is formed on the overall surface by a CVD (chemical vapor deposition) method, and is heat treated in a $POCl_3$ atmosphere, thereby diffusing phosphorus in the layer 204. At this time, the phosphorus is diffused in the substrate 201 in the direct contact region, and a diffusion region 205 which will become a direct contact portion is formed (FIG. 2B).

Subsequently, a photoresist pattern 206 is formed to cover those portions of the poly-silicon layer 204 which will become a gate electrode and an interconnection layer, and the layer 204 is removed by etching using the layer 206 as a mask. This etching may be performed with a reactive ion etching which employs an etchant, e.g., $CCl_4$. The etching stops on the surface of the film 202 in the transistor portion, but does not reach the substrate 201. However, since there is not oxide film in the direct contact portion, a groove 207 is formed in the silicon substrate as shown in FIG. 2C.

Then, the portion of the film 202 which is not covered with the layer 204 is removed by etching to expose the substrate 201; thereafter an impurity, e.g., As is ion implanted in a dose of 3 to $4 \times 10^{15}$ cm$^{-2}$ at an accelerating voltage of 50 kV, and is heat treated, for example, at 1,000° C. for approx. 30 min., thereby forming a source region 208a, a drain region 208b and a diffusion interconnection region 208c of an extension of the drain region 208b, all of which are n+-regions (FIG. 2D). At this time, the impurity is injected to the inner surface of the groove 207, an n+ diffusion region 208d is formed in this portion, thereby electrically connecting a poly-silicon layer 209 to the region 208c.

According to the above-described method, however, the depth and the shape of the groove are not constant, but largely vary depending upon the conditions of etching and the time of an overetching. Therefore, the resistance value of the region 208d in this groove portion becomes remarkably irregular. When the groove 207 is largely formed, for example, in a circular sectional shape as shown in FIG. 2E, a diffusion region is not formed in the side walls of the groove 207, resulting in an electric isolation between the layer 209 and the layer 208c. Such a problem becomes an important problem as a junction depth becomes shallow upon microminiaturization of the device, causing a remarkable decrease in the yield of the LSI. Further, a crystal defect produced in the vicinity of the groove 207 by the reactive ion etching causes an increase in the junction leakage in the diffusion layer, resulting in a problem such as a decrease in the performance of the device.

The foregoing description relates to the case of an n-channel MOS transistor formed on the p-type silicon substrate. The following important problem exists in a so-called CMOS (Complementary MOS) circuit in which a p-channel MOS transistor and an n-channel MOS transistor are formed on the same substrate. In the portion of the p-channel transistor when an n+-type is used as a poly-silicon layer, as shown, for example, in FIG. 3A, a source region 308a, a drain region 308b and a diffusion interconnection region 308c of an extension of the region 308b are p+-type diffusion layers formed, for example, by boron ion implantation. However, a direct contact portion 305 is an n+-type diffusion region (when steps similar to those in FIGS. 2A to 2D are employed), and a p-n junction is not formed between an n+-type direct contact portion 305 and an n-type silicon substrate 301, and the portion 305 and the substrate 301 will shortcircuit.

When only a gate electrode 310 made of an n+-type poly-silicon is initially formed, for example as shown in FIG. 3B, then a source region 308a, a drain region 308b and a diffusion interconnection region 308c made of a p+-type diffusion layer and thereafter an n+-type polysilicon layer 309 are formed, and then an n-type direct contact portion 311 are formed by a diffusion of an impurity from the layer 309, a p-n junction is formed between the portion 311 and the region 308c, and an ohmic contact is not formed.

Thus, when an interconnection layer made of n+-type poly-silicon is used in the MOS circuit, the diffusion interconnection region and the poly-silicon layer could not be connected by the direct contact method in the p-channel MOS transistor. On the contrary, even when the interconnection layer made of a p+-type polysilicon is used, similar problems exist in the direct contact portion of the n-channel MOS transistor. These problems have caused a significant restriction in the design of the circuit.

SUMMARY OF THE INVENTION

It is an object of the present invention to provide a method of manufacturing a semiconductor device which comprises connecting a diffusion interconnection region with an interconnection layer by a direct contact method and which is capable of increasing the integration of the device, the yield, and the degree of design freedom.

According to an aspect of the present invention, there is provided a method of manufacturing a semiconductor device which comprises the steps of forming an interconnection layer through an insulating film on a semiconductor substrate, and connecting the diffusion interconnection region in the surface portion of said substrate to said interconnection layer by growing a metal or metal semiconductor compound on the surface of said substrate and the interconnection layer.

In the method of the present invention, the thickness of the insulating film is preferably 50 to 1,500 Å, and the thickness of the grown metal or metal semiconductor compound layer is 300 to 2,000 Å.

A method of growing the metal or metal semiconductor compound includes, for example, a method of alloying the silicon by the steps of depositing the metal film on the overall surface and annealing the metal, and a method using a metal vapor atmosphere for this growing.

According to the method of the present invention, it is possible to perform the connection of the diffusion interconnection region to the interconnection layer with a high yield. When the method of the present invention is applied, for example, to the manufacture of a CMOS device, both p-type and n-type poly-silicon interconnection layers can be connected to both diffusion interconnection regions of n-channel transistor and p-channel transistors, thereby increasing the degree of freedom of designing the LSI. Further, when the metal or metal semiconductor compound is selectively grown, the direct contact of the diffusion interconnection region and the interconnection layer is possible. Therefore, the integration can be significantly increased as compared with the method of connecting the two by forming the contact hole in the insulating film and forming the metal member therein.

BRIEF DESCRIPTION OF THE DRAWINGS

The present invention is best understood by reference to the accompanying drawings of which.

DETAILED DESCRIPTION OF THE PREFERRED EMBODIMENTS

The embodiments of the present invention will now be described in more detail with reference to the accompanying drawings.

FIGS. 4A to 4E show an embodiment in which the method of the present invention is applied to the connection of the diffusion interconnection region and the interconnection layer in an MOS transistor.

Figure 1A:
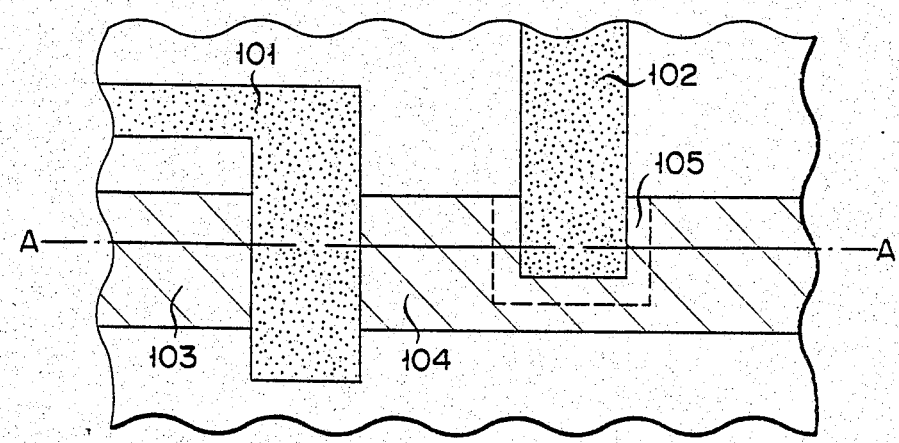
FIG. 1A is a sectional view showing an MOS transistor for describing a conventional direct contact method.
Figure 1B:
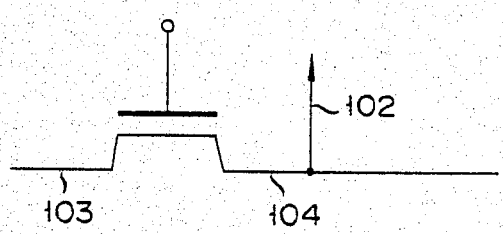
FIG. 1B is a circuit diagram of the device in FIG. 1A.
Figure 2A:
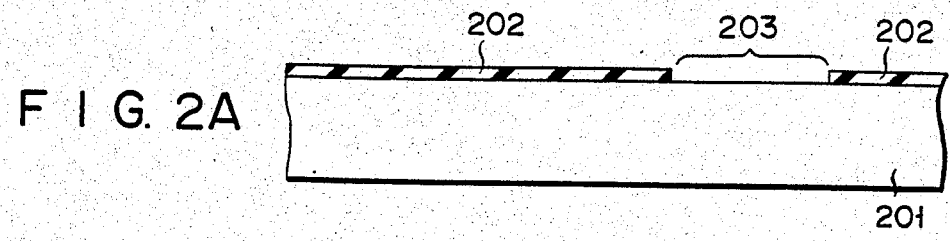
FIGS. 2A to 2E are sectional views showing the steps of the conventional direct contact method.
Figure 2B:
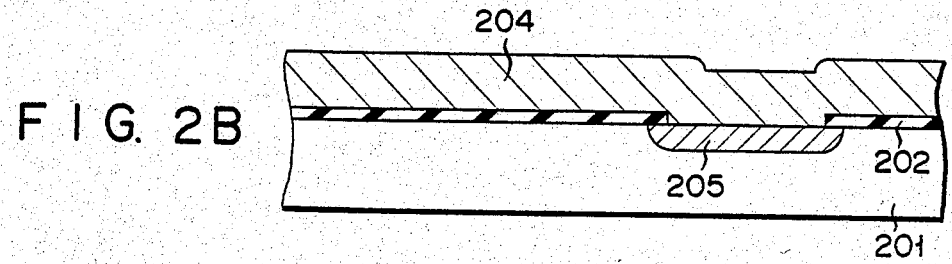
Figure 2C:
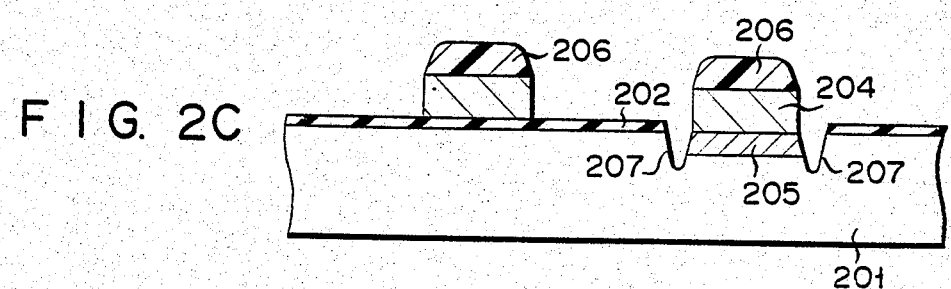
Figure 2D:
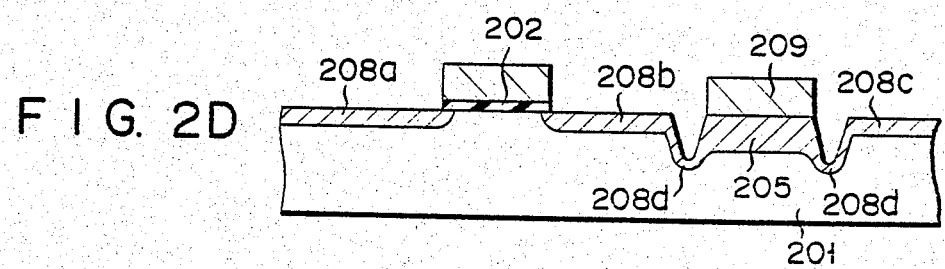
Figure 2E:
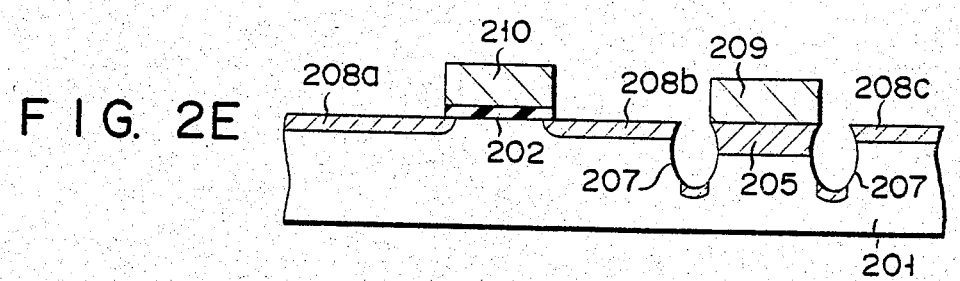
Figure 3A:
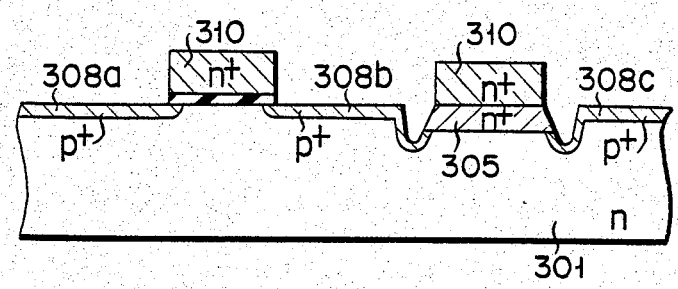
FIGS. 3A and 3B are sectional views showing defects of the conventional direct contact method in the CMOS.
Figure 3B:
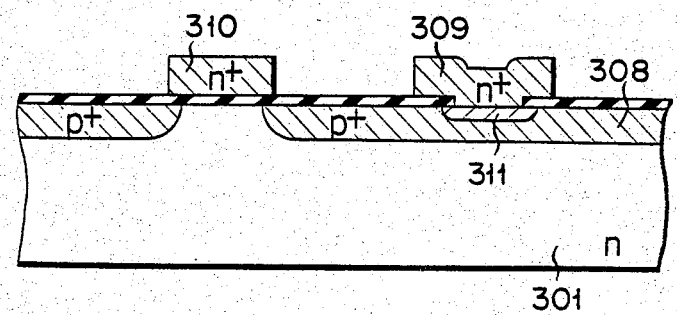
Figure 4A:
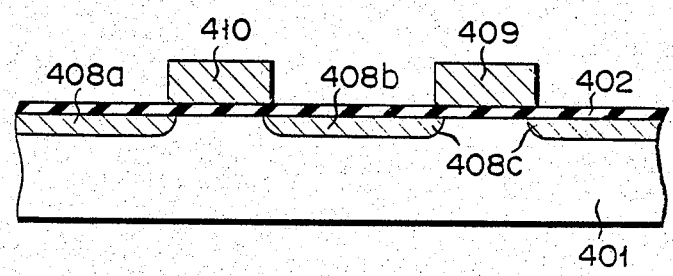
FIGS. 4A to 4E are sectional views showing the steps of manufacturing an n-channel MOS LSI according to the present invention.

As shown in FIG. 4A, an oxide film 402 having, for example, 50 to 1,500 Å, e.g., 100 Å is formed by thermal oxidation, for example, on a p-type silicon substrate 401, and a poly-silicon is then deposited and patterned on the overall surface, thereby forming a gate electrode 410 and an interconnection layer 409. These electrodes 410 and 409 are formed of poly-silicon which includes an impurity such as phosphorus or arsenic. The impurity may be introduced into the poly-silicon layer when it is deposited or it may be doped in the poly-silicon layer by a heat treatment, for example, in $POCl_3$ or an ion implantation of phosphorus or arsenic, after the formation of the poly-silicon layer. Or, an impurity may be doped simultaneously with the later formation of source and drain regions. Then, arsenic is, for example, ion implanted at an accelerating voltage of 50 kV in a dose of 3 to $5 \times 10^{15}$ cm$^{-2}$, thereby forming a source region 408a, a drain region 408b and a diffusion interconnection region 408c. This ion implantation may be performed through the film 402, or may be performed after its removal. In the field region (the region around the region shown in FIG. 4A), a thick field insulating film is formed. Subsequently, a heat treatment is conducted in an oxidation atmosphere or $N_2$ atmosphere having, for example, a temperature of 1,000° C., thereby activating the ion implanted arsenic.

Figure 4B:
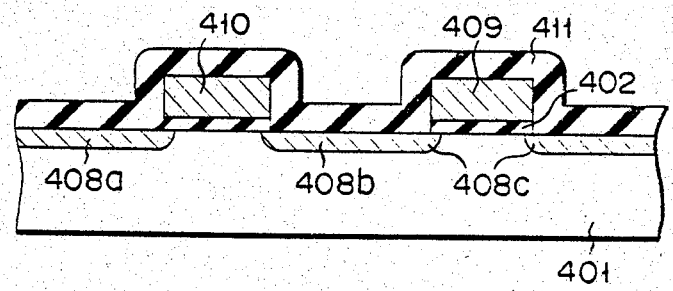
Figure 4C:
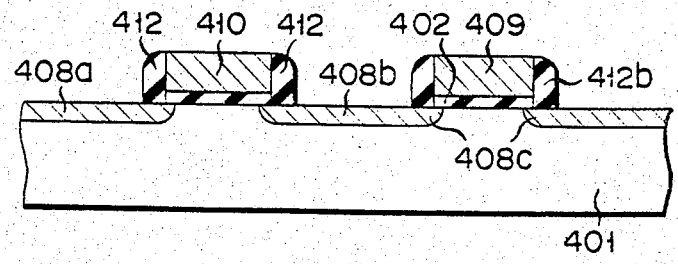

Then, as shown in FIG. 4B, $SiO_2$ is deposited by a CVD method on the overall surface, thereby forming an $SiO_2$ film 411. The film 411 may be formed by thermal oxidation. Thereafter, the film 411 is etched by an anisotropic etching such as a reactive ion etching using an etchant, e.g., a gas mixture of $CF_4$ and $H_2$, thereby exposing the regions 408a, 408b and 408c, and $SiO_2$ films 412a and 412b are retained on the side walls of the electrode 410 and the layer 409, respectively (FIG. 4C).

Figure 4D:
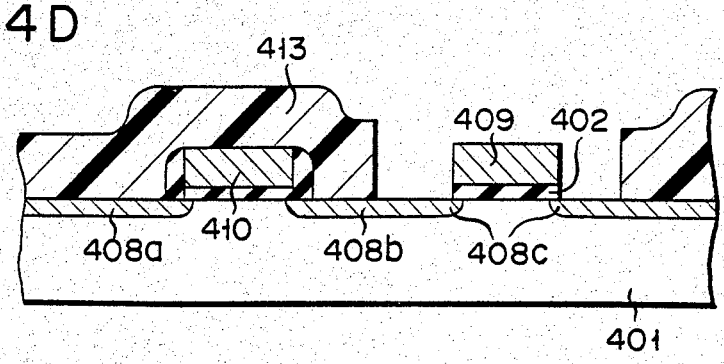

Subsequently, a photoresist film 413 is coated on the region excluding the layer 409 and its periphery. Then, the film 412b of the side wall of the layer 409 is removed by etching such as, for example, with $NH_4F$ (FIG. 4D). After the removal of the film 413, a Pt film is formed by a vacuum evaporation to a thickness of approx. 500 Å, and is annealed, for example, at 550° C. for approx. 15 min., and a PtSi (platinum silicide) layer 414 is formed on the portion where the Pt film and the silicon or poly-silicon are contacted. Subsequently, the unreacted Pt film is removed with aqua regia, thereby obtaining a structure shown in FIG. 4E. The layer 414 is formed on a source region 408a, a drain region 408b and diffusion interconnection region 408c, on a gate electrode 410, and on upper and side surfaces of the layer 409, but is not formed on the $SiO_2$ film 412a. Thus, the continuous PtSi film 414 is formed to a thickness of, for example, about 1,000 Å, on the upper and side surfaces of the layer 409 and on the diffusion regions 408b, 408c, thereby connecting the layer 409 and the region 408c.

Figure 5A:
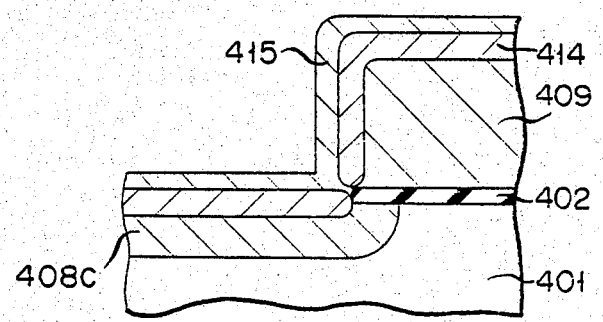
FIGS. 5A and 5B are enlarged views of the connection portion of the diffusion interconnection region and the interconnection layer in FIG. 4E.
Figure 5B:
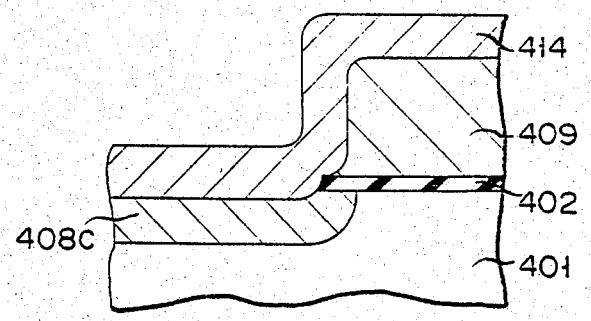

FIGS. 5A and 5B show enlarged views of the connecting portion, FIG. 5A shows the intermediate state of formation of the PtSi layer 414, and FIG. 5B shows the finished state of the forming reaction of the PtSi. As evident from FIG. 5B, the layer 409 and the region 408c are not directly connected due to the intermediary of the oxide film 402, but are connected through the layer 414 formed on the respective surfaces.

Figure 4E:
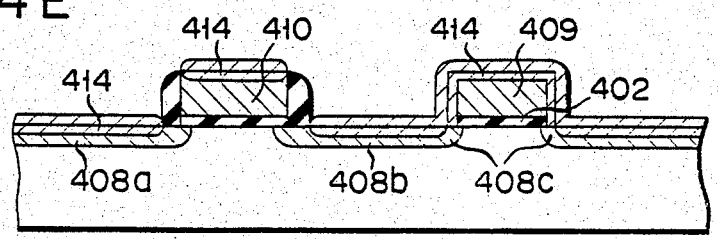
Figure 6:
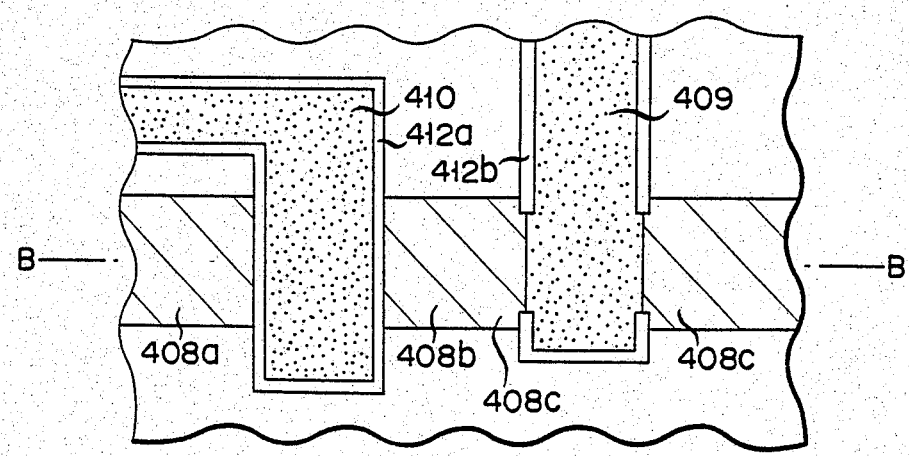
FIG. 6 is a plan view of FIG. 4E.

In the step shown in FIG. 4D, the SiO$_2$ film 412b on the side wall of the layer 409 is removed, but it is not necessary to remove all of the film 412b. As shown in FIG. 6, it is sufficient to remove only the connecting portion to the region 408c. As shown in FIG. 6, part of the film 412 is removed, and the other part is retained, thereby preventing the field oxide layer from becoming thin. FIG. 4E corresponds to the sectional view along the line B—B in FIG. 6. In the embodiment described above, the SiO$_2$ film 412b is retained on the side walls of the layer 409 as shown in FIG. 4C, and thereafter is removed by etching as shown in FIG. 4D. However, the present invention is not limited to this embodiment. For example, that portion of the SiO$_2$ film on the upper and side surfaces of the layer 409 and its periphery is etched off using a photoresist film as a mask, and then the residual SiO$_2$ film is subjected to RIE (reactive ion etching) to be retained on the side wall of the electrode 410.

The method according to the present invention, as described above, does not comprise the step of removing the oxide film by etching before forming the poly-silicon layer at the connecting portion between the interconnecting layer and the diffusion interconnection region. Therefore, when the poly-silicon layer is etched, due to the presence of the oxide film, the formation of the groove and the etching of the substrate are prevented, unlike in the conventional method. Therefore, the problem that the resistance in the direct contact portion will vary according to the overetching time of the poly-silicon and that the contact cannot be formed can be eliminated. Further, since the substrate is not exposed, the problem that the leak current of the p-n junction increases due to the crystal defects produced in the substrate in the reactive ion etching step can also be eliminated. Moreover, since the interconnection layer and the substrate are insulated via the oxide film, even if the p$^+$-type poly-silicon is, for example, used instead of the n$^+$-type poly-silicon, no shortcircuit occurs between the interconnection layer and the substrate as in the conventional device.

Figure 7:
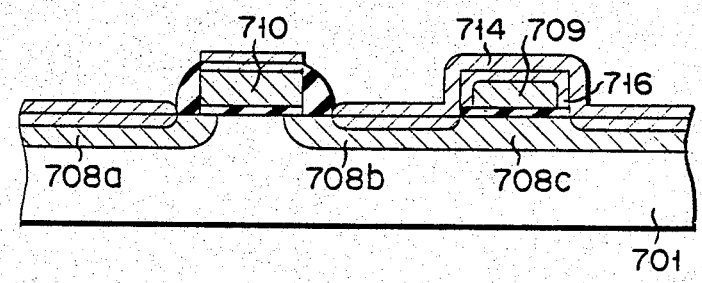
FIG. 7 is a sectional view of the MOS transistor obtained according to another embodiment of the present invention.

In the embodiment described above, the electrode 410 and the layer 409 are simultaneously formed by patterning of the poly-silicon layer. However, the present invention is not limited to this embodiment. For example, as shown in FIG. 7, a gate electrode 701 made of poly-silicon is initially formed, then arsenic is ion implanted into the substrate 701 to form a source region 708a, a drain region 708b and a diffusion interconnection region 708c of the extension of the drain region 708b, thereafter an interconnection layer 709 made of poly-silicon is formed through an oxide film 716, and then steps similar to those shown in FIGS. 4B to 4E may be performed. In this case, even if the layer 709 is p-type, a p-n junction is not formed between the layer 709 and the n-type interconnection region 708c due to the presence of the film 716. Further, since the PtSi and the n$^+$-type and p$^+$-type silicon form an ohmic contact, the layer 709 and the region 708c will always form an ohmic contact.

In the embodiments described above, the case of the p-type substrate has been described. However, the present invention is not limited to this. In the case of an n-type substrate, or even in the case of a CMOS circuit which includes both the p-type and the n-type, the present invention can be applied similarly. In the embodiments described above, the gate electrode and the interconnection layer are formed of poly-silicon. However, instead of the poly-silicon it is also possible for them to be formed of a so-called "polycide", i.e., a two-layer structure of poly-silicon and a metal silicide. Even in the case of the polycide, it is possible to form another metal silicide layer on top of the metal silicide layer of the upper layer in the step shown in FIG. 4E.

In the embodiments described above, the PtSi layer is formed by thermal annealing. However, the present invention is not limited to this, but the metal or metal semiconductor compound may be grown by various methods. The growing method of the metal or metal semiconductor compound including the case of forming the PtSi layer by thermal annealing will now be described.

A metal is deposited on the entire surface of a silicon wafer and thermal annealing is performed. The metal silicide is produced only at positions where the metal and silicon come in contact. As a result, a metal silicide film is formed on the source region, the drain region, the diffusion interconnection region and the interconnection layer and may be formed on the upper surface of the gate electrode. The metal which is deposited on the field oxide film and the side walls of the gate electrode may easily be eliminated by, for example, an acid treatment. Metals such as W, Pd, Pt, Ni, Mo, Nb, Ta, Ir, and Ti which react with silicon to produce a stable silicide film may be used. Pt is easy to use for this purpose.

Formation of the metal silicide film may be performed by irradiation by a laser beam after the metal is deposited, instead of by thermal annealing. For example, after the metal is deposited, the silicon region may be scanned with the laser beam once at an output of about 10 W by using a CW-Ar laser so that the same results as in annealing described above may be obtained. The method in which the laser beam is used has advantages in that the temperature of the wafer is not made high. Further, when the laser beam is used, it may be selectively radiated on only predetermined spots so that the metal silicide film may be selectively formed. In this case, the insulating material on the side faces of the gate electrode prevents thermal conduction between the desired metal silicide layer and the gate electrode. The same effect may be obtained when a CW electron beam is used instead of the laser beam. Further, the metal silicide layer may be formed by ion-implanting an impurity, for example Ar, at an interface of the metal layer with the silicon or into the silicon substrate after the metal is deposited. This method is called "ion beam mixing". According to this method, even if a thin oxide film (at a thickness of, for example, 10 to 20 Å) or contaminant such as carbon derived from a vacuum pumping system remains on the surface of the silicon wafer before the metal is deposited, the stable metal silicide layer is easily formed by reacting the metal and the silicon. Therefore, problems such as nonuniform formation of the metal silicide layer due to the presence of the thin oxide film or contaminant, high contact resistance between the metal silicide layer and the silicon layer, and the like are eliminated. Therefore, the yield of the wafers increases by about 10 to 20% as compared with a method according to thermal annealing. The impurity here is not limited to Ar, and other impurities such as As, Si and Xe may be used. Furthermore, since the ion beam mixing method does not necessarily require a heating process, in the MIS semiconductor device which is produced in a proportional-reduced scale, a shallow low resistance layer may be formed. According to the ion beam mixing method, the metal silicide layer and simultaneously the source, drain and diffusion interconnection regions are formed by using an impurity of opposite conductivity type to that of the silicon substrate. For forming $P^+$-source, drain and diffusion interconnection regions, ions with larger masses such as Si, Ar and Xe may be implanted with boron to enhance the ion beam mixing effect. In addition to this, when Pd is used as the metal, more PdSi is formed than $Pd_2Si$. Therefore, this method has an advantage in that the silicide layer is formed having a resistivity which is $\frac{2}{3}$ to $\frac{1}{2}$ the resistivity of the silicide layer obtained by thermal annealing. By performing the annealing after the ion beam mixing is performed and before the unreacted metal film is eliminated, the silicidation reaction may be promoted and the thickness of the metal silicide layer may be increased. Thermal annealing, CW laser beam irradiation, CW electron beam irradiation or the like may be used for annealing in this stage. Since the annealing after the ion beam mixing and after or before the removal of the unreacted metal film is effective towards improvement of crystallizability of metal silicide and lowering of resistivity of the diffusion regions, it is desirable to perform such annealing.

Formation of the metal film on the silicon region on which the insulating film is not formed will be described. The wafer is heated at a temperature above 200° C., while a metal halide gas, or a mixture of a metal halide gas and a reducing gas are introduced, so that a metal layer is selectively formed on the exposed silicon region only. A metal such as W, Pd, Pt, Ni, Mo, Nb, Ta, Ti, or other metals which may be deposited on the silicon layer by the halide reduction may be used for the metal here. For example, W or Mo may be deposited on the silicon layer by using a gas of $WF_6$ or $MoF_6$, or a gas mixture of $WF_6$ or $MoF_6$ and $H_2$.

Figure 8:
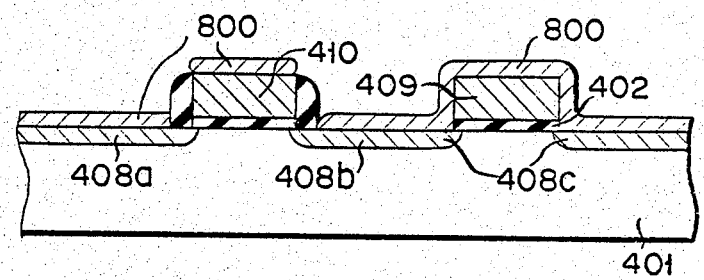
FIG. 8 is a sectional view of the MOS transistor obtained according to still another embodiment of the present invention.

FIG. 8 shows a sectional view of an MOS transistor produced by placing a substrate at 200° to 600° C. in a gas mixture of $WF_6$ and $H_2$, thereby forming a W layer selectively only on the surfaces of the silicon and the poly-silicon. This structure is similar to that in FIG. 4E except that the metal silicide is not formed by the reaction of the metal and the silicon in the section of the MOS transistor. Reference numeral 800 shows the W layer thus formed.

After the metal film or metal silicide film is formed on the silicon region which is exposed and on which the insulating film is not formed, the insulating film which is formed on the side walls of the gate electrode may be eliminated and an impurity of opposite conductivity type to that of the silicon substrate may be ion-implanted. The doping of the impurity into source region, the drain region, the diffusion interconnection region and the interconnection layer may thus be formed. In the method in which the metal or metal silicide layer is formed after the impurity is ion-implanted, oil of a vacuum pump is ionized by accelerated ions so that the oil ions become attached to the surface of the silicon substrate to form a carbon film. The carbon film is not sufficiently eliminated in a cleaning process and formation of the metal or metal silicide layer may be impaired. However, in the method in which the impurity is ion-implanted after the metal or metal silicide layer is formed as described above, the problem described above is eliminated.

What is claimed is:

1. A method of manufacturing a semiconductor device comprising the steps of:
    forming an insulating film on a semiconductor substrate;
    forming a gate electrode and an interconnection layer on said insulating film;
    introducing an impurity of conductivity type opposite to that of said substrate into said substrate to form a source, drain and diffusion interconnection regions;
    forming an insulating layer on the entire surface of said insulating film, gate electrode and interconnection layer;
    etching said insulating layer and insulating film by an anisotropic etching, thus leaving insulating layers on the side walls of said gate electrode and interconnection layer;
    removing that portion of the insulating layer on the side walls of the interconnection layer which adjoins the diffusion interconnection region in the surface portion of said substrate; and
    connecting the diffusion interconnection region to said interconnection layer by growing a substance selected from the group consisting of metals and metal semiconductors on the surface of said substrate and the interconnection layer.

2. The method according to claim 1, wherein said interconnection layer is formed of an impurity-doped poly-silicon.

3. The method according to claim 1, wherein said interconnection layer is formed by patterning the poly-silicon layer together with a gate electrode.

4. The method according to claim 1, wherein said diffusion interconnection region is an extension of at least one of a source region and a drain region.

5. A method according to claim 1, wherein said growing step includes the steps of heating said semiconductor substrate at a temperature above 200° C., surrounding said semiconductor substrate with a metal halide gas or a mixture of a metal halide gas and a reducing gas, and depositing a metal film on the exposed surfaces of said semiconductor substrate and said interconnection layer.

6. A method according to claim 5, wherein the metal is a member selected from the group consisting of W, Pd, Pt, Ni, Mo, Nb, Ta and Ti.

7. The method according to claim 1, wherein said interconnection layer is formed of a two-layer structure of an impurity-doped poly-silicon and a metal silicide.

8. The method according to claim 1, wherein said substance is a metal.

9. The method according to claim 1 wherein said substance is a metal semiconductor.

10. A method according to claim 1, wherein said growing step includes the steps of depositing a metal on the entire surface of the structure, forming a metal silicide film on the surfaces of the semiconductor substrate and the interconnection layer by reacting the semiconductor substrate and the interconnection layer with the metal which is in contact with them, and eliminating unreacted metal.

11. A method according to claim 10, wherein the reaction between the metal and the silicon is performed by a method of thermal annealing.

12. A method according to claim 10, wherein the reaction between the metal and silicon is performed by ion-implanting an impurity which has a conductivity type opposite to the conductivity type of said semiconductor substrate.

13. A method according to claim 10, wherein the metal is a member selected from the group consisting of W, Pd, Pt, Ni, Mo, Nb, Ta, Ir and Ti.

14. A method according to claim 10, wherein the reaction between the metal and silicon is performed by a method of laser beam irradiation.

15. A method according to claim 10, wherein the reaction between the metal and silicon is performed by a method of electron beam irradiation.

16. A method according to claim 10, wherein the reaction between the metal and silicon is performed by a method of ion-implantation.

* * * * *